(12) United States Patent
Chen

(10) Patent No.: US 11,195,900 B2
(45) Date of Patent: *Dec. 7, 2021

(54) ARRAY SUBSTRATE WITH PROTRUSION PATTERNS AND METHOD OF FABRICATING SAME

(71) Applicant: Wuhan China Star Optoelectronics Semiconductor Display Technology Co., Ltd., Hubei (CN)

(72) Inventor: Cheng Chen, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 24 days.

This patent is subject to a terminal disclaimer.

(21) Appl. No.: 16/622,131

(22) PCT Filed: Sep. 30, 2019

(86) PCT No.: PCT/CN2019/109308
§ 371 (c)(1),
(2) Date: Dec. 12, 2019

(87) PCT Pub. No.: WO2021/042438
PCT Pub. Date: Mar. 11, 2021

(65) Prior Publication Data
US 2021/0066426 A1 Mar. 4, 2021

(30) Foreign Application Priority Data
Sep. 2, 2019 (CN) .......................... 201910823391.X

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 27/3234* (2013.01); *H01L 27/3246* (2013.01);
(Continued)

(58) Field of Classification Search
CPC ............ H01L 27/3276; H01L 27/3234; H01L 27/3246; H01L 27/3248; H01L 27/3265;
(Continued)

(56) References Cited

U.S. PATENT DOCUMENTS 8,975,761 B2   3/2015 Jung
10,050,223 B2 * 8/2018 Im ...................... H01L 51/5228
(Continued)

FOREIGN PATENT DOCUMENTS

CN    107783698 A    3/2018
CN    107818988 A    3/2018
(Continued)

*Primary Examiner* — Lex H Malsawma
(74) *Attorney, Agent, or Firm* — The Roy Gross Law Firm, LLC; Roy Gross

(57) ABSTRACT

An array substrate and a method of fabricating the same are described. The array substrate has an active area and a winding area, wherein the array substrate has a base substrate, an active layer, a first insulating layer, a first metal layer, a second insulating layer, a second metal layer, a third insulating layer, a third metal layer, a patterned flat layer, a pixel defining layer, and a support layer. The first metal layer has at least one first wiring pattern. The second metal layer has at least one second wiring pattern. The third metal layer has at least one third wiring pattern. The pixel defining layer together with the support layer within the winding area have at least one undercut structure. The array substrate and the method of fabricating the same can reduce a width of a boundary formed by the winding area.

15 Claims, 5 Drawing Sheets

(52) U.S. Cl.
CPC ...... *H01L 27/3248* (2013.01); *H01L 27/3265* (2013.01); *H01L 51/0017* (2013.01); *H01L 51/56* (2013.01); *H01L 2227/323* (2013.01)

(58) Field of Classification Search
CPC ................ H01L 51/0017; H01L 51/56; H01L 2227/323

See application file for complete search history.

(56) References Cited

U.S. PATENT DOCUMENTS

| | | | |
|---|---|---|---|
| 10,826,012 B2* | 11/2020 | Choi | H01L 51/5036 |
| 2016/0043341 A1* | 2/2016 | Heo | H01L 51/5228 |
| | | | 257/40 |
| 2016/0149155 A1* | 5/2016 | Kim | H01L 27/3276 |
| | | | 257/40 |
| 2016/0293888 A1* | 10/2016 | Shim | H01L 51/5228 |
| 2017/0277326 A1 | 9/2017 | Cao et al. | |
| 2018/0190934 A1* | 7/2018 | Choi | H01L 27/3246 |
| 2019/0131562 A1 | 5/2019 | Rhe et al. | |
| 2019/0165072 A1 | 5/2019 | Wang | |
| 2019/0245015 A1* | 8/2019 | Lee | H01L 51/5246 |
| 2020/0176709 A1* | 6/2020 | Moon | H01L 51/5253 |

FOREIGN PATENT DOCUMENTS

| | | |
|---|---|---|
| CN | 109671870 A | 4/2019 |
| CN | 109728038 A | 5/2019 |
| CN | 110112191 A | 8/2019 |

\* cited by examiner

ARRAY SUBSTRATE WITH PROTRUSION PATTERNS AND METHOD OF FABRICATING SAME

FIELD OF DISCLOSURE

The present disclosure relates to a substrate and a method of fabricating the same, and more particularly to an array substrate and a method of fabricating the same.

BACKGROUND OF DISCLOSURE

A full screen is one of goals of development of organic light emitting diode (OLED) display technology. A current under-display camera technology is mainly to form a hole in the display panel that receives a camera. However, the above-described hole is formed by removing a base substrate in a camera area, which easily affects a packaging effect and has a problem of poor reliability.

In order to solve above problem, a conventional technology is to provide a plurality of groove structures under a transistor structure of the array substrate at a position adjacent to the hole (for example, at a boundary between an active area and the camera area), wherein each of the plurality of groove structures has an undercut structure. When a packaging step is subsequently performed, an organic layer (or an inorganic layer) formed by evaporation may be broken due to poor step-coverage of the undercut structure. A broken organic layer (or a broken inorganic layer) covers the plurality of groove structures, thereby protecting the active area from moisture or oxygen, and improving reliability of the display panel.

Further, current metal signal lines are arranged in parallel and surround the hole to form a winding area with a certain width. In addition, in the current display panel, the winding area and the plurality of groove structures arranged in parallel may form a border of the camera area under the screen, and formation of the border may reduce a screen ratio of the full screen. This reduces visual experience of the full screen.

Therefore, it is necessary to provide an array substrate and a method of fabricating the same to solve the problems of the conventional technology.

SUMMARY OF DISCLOSURE

In view of the above, the present disclosure provides an array substrate and a method of fabricating the same so as to solve a problem of the conventional technology that a border formed by the winding area and the plurality of groove structures disposed in parallel reduces a screen ratio of the full screen.

An object of the present disclosure is to provide an array substrate and a method of fabricating the same, which reduce width of the border formed by a winding area, by forming a first wiring pattern, a second wiring pattern, and an undercut structure within the winding area, all of which are layer-stacked.

To achieve the above object of the present disclosure, an embodiment of the present disclosure provides an array substrate comprising a base substrate, an active layer, a first insulating layer, a first metal layer, a second insulating layer, a second metal layer, a third insulating layer, a third metal layer, a patterned flat layer, a pixel defining layer, and a support layer. The active layer is disposed on the base substrate within the active area. The first insulating layer is disposed on the active layer within the active area and on the base substrate within the winding area. The first metal layer is disposed on the first insulating layer, wherein the first metal layer comprises at least one first wiring pattern disposed on the first insulating layer within the winding area, wherein the first metal layer further comprises a first gate electrode structure pattern layer disposed on the first insulating layer within the active area. The second insulating layer is disposed on the first metal layer. The second metal layer is disposed on the second insulating layer, wherein the second metal layer comprises at least one second wiring pattern disposed on the second insulating layer within the winding area. The third insulating layer is disposed on the second metal layer. The third metal layer is disposed on the third insulating layer, wherein the third metal layer comprises at least one third wiring pattern disposed on the third insulating layer within the winding area. The patterned flat layer is disposed on the second metal layer within the active area and on the second metal layer within the winding area, wherein the patterned flat layer located within the winding area includes a plurality of protrusion patterns, and the at least one third wiring pattern includes a plurality of third wiring patterns, wherein one of the plurality of protrusion patterns covers the plurality of third wiring patterns. The pixel defining layer is disposed on the patterned flat layer. The support layer is disposed on the pixel defining layer, wherein the pixel defining layer together with the support layer have at least one undercut structure.

In an embodiment of the present disclosure, the second metal layer further comprises a second gate electrode structure pattern layer disposed on the second insulating layer within the active area.

In an embodiment of the present disclosure, the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

In an embodiment of the present disclosure, the array substrate further comprises a fourth metal layer disposed on the patterned flat layer, wherein the fourth metal layer further comprises an anode layer and an etch stop layer. The anode layer is disposed on the patterned flat layer within the display area, wherein the anode layer is electrically connected to the source/drain structure through a second via hole penetrating the patterned flat layer. The etch stop layer is disposed on the patterned flat layer within the winding area.

To achieve the above object of the present disclosure, an embodiment of the present disclosure provides an array substrate comprising a base substrate, an active layer, a first insulating layer, a first metal layer, a second insulating layer, a second metal layer, a third insulating layer, a third metal layer, a patterned flat layer, a pixel defining layer, and a support layer. The active layer is disposed on the base substrate within the active area. The first insulating layer is disposed on the active layer within the active area and on the base substrate within the winding area. The first metal layer is disposed on the first insulating layer, wherein the first metal layer comprises at least one first wiring pattern disposed on the first insulating layer within the winding area. The second insulating layer is disposed on the first metal layer. The second metal layer is disposed on the second insulating layer, wherein the second metal layer comprises at least one second wiring pattern disposed on the second insulating layer within the winding area. The third insulating layer is disposed on the second metal layer. The third metal layer is disposed on the third insulating layer, wherein the third metal layer comprises at least one third wiring pattern disposed on the third insulating layer within the winding area. The patterned flat layer is disposed on the second metal layer within the active area and on the second metal layer within the winding area. The pixel defining layer is disposed on the patterned flat layer. The support layer is disposed on the pixel defining layer, wherein the pixel defining layer together with the support layer have at least one undercut structure.

In an embodiment of the present disclosure, the first metal layer further comprises a first gate electrode structure pattern layer disposed on the first insulating layer within the active area.

In an embodiment of the present disclosure, the second metal layer further comprises a second gate electrode structure pattern layer disposed on the second insulating layer within the active area.

In an embodiment of the present disclosure, the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

In an embodiment of the present disclosure, the array substrate further comprises a fourth metal layer disposed on the patterned flat layer, wherein the fourth metal layer further comprises an anode layer and an etch stop layer. The anode layer is disposed on the patterned flat layer within the display area, wherein the anode layer is electrically connected to the source/drain structure through a second via hole penetrating the patterned flat layer. The etch stop layer is disposed on the patterned flat layer within the winding area.

In an embodiment of the present disclosure, the patterned flat layer located within the winding area includes a plurality of protrusion patterns, and the at least one third wiring pattern includes a plurality of third wiring patterns, wherein one of the plurality of protrusion patterns covers the plurality of third wiring patterns.

Further, another embodiment of the present disclosure provides a method of fabricating an array substrate. The array substrate comprises an active area and a winding area. The method of fabricating the array substrate comprises steps of: providing a base substrate; forming an active layer on the base substrate within the active area; forming a first insulating layer on the active layer within the active area and on the base substrate within the winding area; forming a first metal layer on the first insulating layer, wherein the first metal layer comprises at least one first wiring pattern disposed on the first insulating layer within the winding area; forming a second insulating layer on the first metal layer; forming a second metal layer on the second insulating layer, wherein the second metal layer comprises at least one second wiring pattern disposed on the second insulating layer within the winding area; forming a third insulating layer on the second metal layer; forming a third metal layer on the third insulating layer, wherein the third metal layer comprises at least one third wiring pattern disposed on the third insulating layer within the winding area; forming a patterned flat layer on the third metal layer within the active area and on the third metal layer within the winding area; forming a pixel defining layer on the patterned flat layer; forming a support layer on the pixel defining layer; and performing an etching step on the pixel defining layer and the support layer, so that the pixel defining layer together with the support layer after performing the etching step have at least one undercut structure.

In an embodiment of the present disclosure, the first metal layer further comprises a first gate electrode structure pattern layer disposed on the first insulating layer within the active area, and the second metal layer further comprises a second gate electrode structure pattern layer disposed on the second insulating layer within the active area.

In an embodiment of the present disclosure, the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

In an embodiment of the present disclosure, after the step of forming the patterned flat layer and before the step of forming the pixel defining layer, the method of fabricating the array substrate further comprises steps of: forming a fourth metal layer disposed on the patterned flat layer, wherein the fourth metal layer further comprises an anode layer and an etch stop layer. The anode layer is disposed on the patterned flat layer within the display area, wherein the anode layer is electrically connected to the source/drain structure through a second via hole penetrating the patterned flat layer. The etch stop layer is disposed on the patterned flat layer within the winding area.

In an embodiment of the present disclosure, the patterned flat layer located within the winding area includes a plurality of protrusion patterns, and the at least one third wiring pattern includes a plurality of third wiring patterns, wherein one of the plurality of protrusion patterns covers the plurality of third wiring patterns.

Compared with the conventional technology, the array substrate and the method of fabricating the same of the present disclosure reduce width of the border formed by the winding area, by forming a first wiring pattern, a second wiring pattern, a third wiring pattern, and an undercut structure within the winding area, all of which are layer-stacked. Further, since the first wiring pattern, the second wiring pattern, the third wiring pattern, and the undercut structure can be formed together with components of the active area, a using number of photomasks can be reduced.

To make the above description of the present disclosure more clearly comprehensible, it is described in detail below in examples of preferred embodiments with the accompanying drawings.

DETAILED DESCRIPTION OF PREFERRED EMBODIMENTS

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures. Therefore, the used directional terms are used to describe and understand the present disclosure, but the present disclosure is not limited thereto.

Figure 1A:
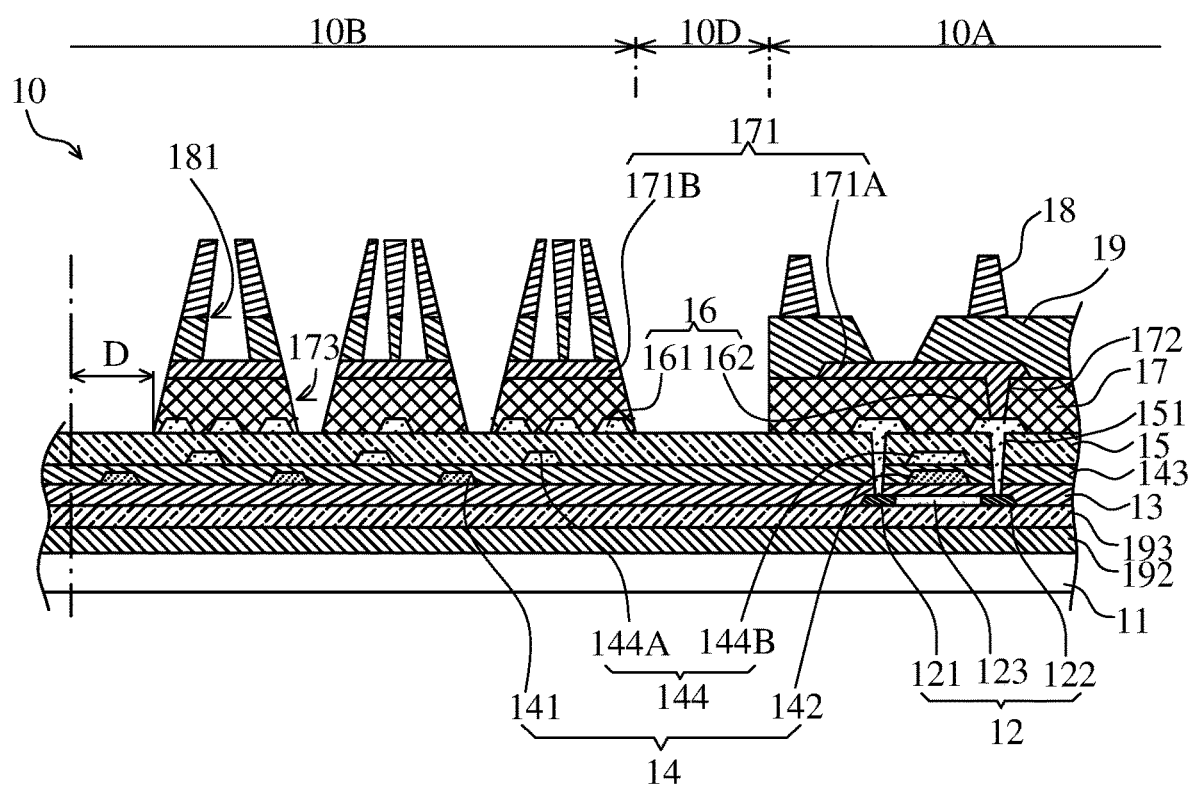
FIG. 1A is a schematic cross-sectional view of an array substrate in accordance with an embodiment of the present disclosure.
Figure 1B:
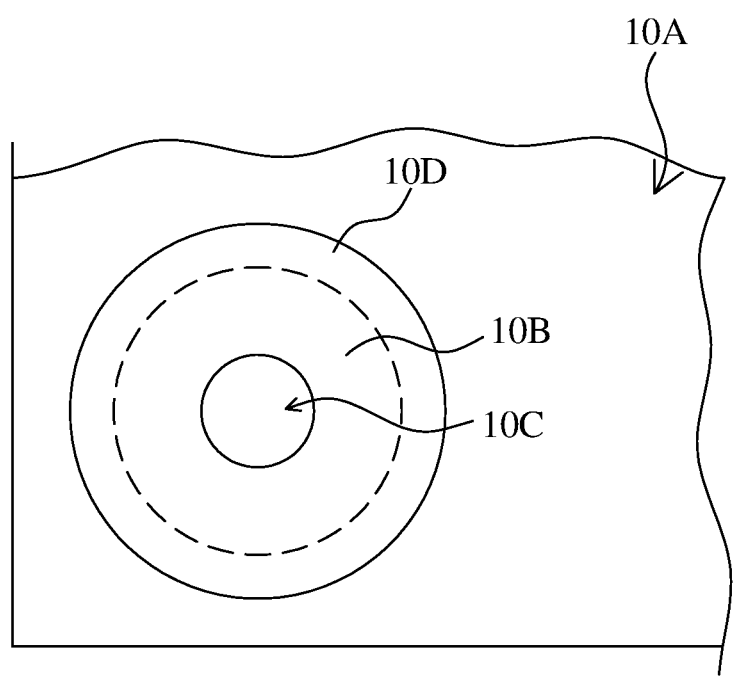
FIG. 1B is a schematic diagram of an active area, a winding area, an opening hole area, and a packaging area of an array substrate in accordance with an embodiment of the disclosure.

Referring to FIG. 1A and FIG. 1B, an array substrate 10 of an embodiment of the present disclosure comprises an active area (AA) 10A and a winding area 10B. In an embodiment, the array substrate further comprises an opening hole area 10C, wherein the winding area 10B is between the active area 10A and the opening hole area 10C. In an example, the opening area 10C can be used to receive an under-screen component such as a camera or a fingerprint recognition module.

In an embodiment of the present disclosure, the array substrate 10 comprises a base substrate 11, an active layer 12, a first insulating layer 13, a first metal layer 14, a second insulating layer 143, a second metal layer 144, a third insulating layer 15, a third metal layer 16, a patterned flat layer 17, a pixel defining layer 19, and a support layer 18. In an embodiment, the base substrate 11 can be used to support the active layer 12, the first insulating layer 13, the first metal layer 14, the second insulating layer 143, the second metal layer 144, the third insulating layer 15, the third metal layer 16, the patterned flat layer 17, the pixel defining layer 19, and the support layer 18. In an embodiment, the base substrate 11 is, for example, a flexible substrate, a transparent substrate, or a flexible transparent substrate.

In an embodiment of the present disclosure, the active layer 12 of the array substrate 10 is disposed on the base substrate 11 within the active area 10A. The active layer 12 can include a source electrode doping area 121, a drain electrode doping area 122, and a channel area 123 located between the source electrode doping area 121 and the drain electrode doping area 122, all of which are formed by doping. The source electrode doping area 121, the drain electrode doping area 122, and the channel area 123 are located within the active area 10A.

In an embodiment of the present disclosure, the first insulating layer 13 of the array substrate 10 is disposed on the active layer 12 within the active area 10A and on the base substrate 11 within the winding area 10B. In an embodiment, the first insulating layer 13 is used as a gate electrode insulating layer.

In an embodiment of the present disclosure, the first metal layer 14 of the array substrate 10 is disposed on the first insulating layer 13, wherein the first metal layer 14 comprises at least one first wiring pattern 141 disposed on the first insulating layer 13 within the winding area 10B. In an embodiment, the first metal layer 14 further comprises a first gate electrode structure pattern layer 142 disposed on the first insulating layer 13 within the active area 10A. In another embodiment, the first wiring pattern 141 and the first gate electrode structure pattern layer 142 are formed by a same photomask process, so that a number of photomasks used can be reduced.

In an embodiment of the present disclosure, the second insulating layer 143 of the array substrate 10 is disposed on the first metal layer 14. In an embodiment, the second insulating layer 143 is used as a gate electrode insulating layer.

In an embodiment of the present disclosure, the second metal layer 144 of the array substrate 10 is disposed on the second insulating layer 143, wherein the second metal layer 144 comprises at least one second wiring pattern 144A disposed on the second insulating layer 143 within the winding area 10B. In an embodiment, the second metal layer 144 further comprises a second gate electrode structure pattern layer 144B disposed on the second insulating layer 143 within the active area 10A. In another embodiment, the second wiring pattern 144A and the second gate electrode structure pattern layer 144B are formed by a same photomask process, so that a number of photomasks used can be reduced. In one aspect, the gate electrode layer 142A and the gate electrode layer 142B located within the active area are aligned with each other such that the gate electrode layer 142A and the gate electrode layer 142B form a storage capacitor. On the other hand, in an embodiment, the first wiring pattern 141 and the second wiring pattern 144A located within the winding area 10B do not need to form a storage capacitor, so the first wiring pattern 141 is no need to align with the second wiring pattern 144A. In an embodiment of the present disclosure, the third insulating layer 15 of the array substrate 10 is disposed on the second metal layer 144. In an embodiment, the third insulating layer 15 can be used as an interlayer insulating layer (or interlayer dielectric (ILD)). In an embodiment, the third insulating layer 15 located in the display area 10A includes three types of opening holes. A first type of the opening holes are defined in the active layer 12, a second type of the opening holes are defined in the first metal layer 14, and a third type of the opening holes are defined in the second metal layer 144.

In an embodiment of the present disclosure, the third metal layer 16 of the array substrate 10 is disposed on the third insulating layer 15, wherein the third metal layer 16 comprises at least one third wiring pattern 161 disposed on the third insulating layer 15 within the winding area 10B. In an embodiment, the third metal layer 16 further comprises a source/drain electrode structure pattern 162 disposed on the third insulating layer 15 within the active area 10A, wherein the source/drain electrode structure pattern 162 is electrically connected to the active layer 12 through a first via hole 151 penetrating the third insulating layer 15, the second insulating layer 143, and the first insulating layer 13. In another embodiment, the third wiring pattern 161 and the source/drain electrode structure pattern 162 are formed by a same photomask process, so that a number of photomasks used can be reduced. In still another embodiment, the third metal layer 16 located within the active area 10A is bonded and connected to the active layer 12, the first metal layer 14, and the second metal layer 144 by the three types of opening holes of the third insulating layer 15.

In an embodiment of the present disclosure, the patterned flat layer 17 of the array substrate 10 is disposed on the third metal layer 16 within the active area 10A and on the third metal layer 16 within the winding area 10B. The patterned flat layer 17 can be used to protect and partly planarize a transistor structure formed within the active area 10A and to protect and partly planarize the first wiring pattern 141, the second wiring pattern 144A, and the third wiring pattern 161 located in the winding area 10B. In an embodiment, the array substrate 10 further comprises a fourth metal layer 171 disposed on the patterned flat layer 17, wherein the fourth metal layer further comprises an anode layer 171A and an etch stop layer 171B. The anode layer 171A is disposed on the patterned flat layer 17 within the display area 10A, wherein the anode layer 171A is electrically connected to the source/drain structure 162 through a second via hole 172 penetrating the patterned flat layer 17. The etch stop layer 171B is disposed on the patterned flat layer 17 within the winding area 10B, and can be used, for example, as a barrier layer when forming an undercut structure to be described later.

In an embodiment, the patterned flat layer 17 located within the winding area 10B includes a plurality of protrusion patterns 173, and the at least one third wiring pattern 161 includes a plurality of third wiring patterns 161, wherein one of the plurality of protrusion patterns 173 covers the plurality of third wiring patterns 161. Specifically, referring to FIG. 1A, one of the plurality of protrusion patterns 173 may cover, for example, three third wiring patterns 161. In another embodiment, a protrusion pattern 173 closest to the opening area 10C can have a distance D (e.g., about 1 micron) from the opening area 10C to form a region that does not have a patterned flat layer.

In an embodiment of the present disclosure, the pixel defining layer 19 of the array substrate 10 is disposed on the patterned flat layer 19. Further, a support layer 18 of the array substrate 10 is disposed on the pixel defining layer 19, wherein the pixel defining layer 19 together with the support layer 18 have at least one undercut structure 181. In an example, the pixel defining layer 19 and the support layer 18 have, for example, two or more undercut structures 181. In an embodiment, the pixel defining layer 19 and the support layer 18 may be formed, for example, together (eg, by a halftone photomask technique) or separately (eg, using two photomasks). In another embodiment, material of the pixel defining layer 19 and material of the supporting layer 18 may be the same or different.

It is noted that, the use of the undercut structure 181 is that, when a packaging step is subsequently performed, an organic layer (or an inorganic layer) formed by evaporation may be broken due to poor step-coverage of the undercut structure. A broken organic layer (or a broken inorganic layer) covers the plurality of groove structures, thereby protecting the active area from moisture or oxygen, and improving reliability of the display panel. It is noted that the undercut structure 181 is located above the transistor structure of the array substrate 10 and can be integrated with a fabrication process of the existing array substrate 10, so that a number of photomasks used can be reduced. In an embodiment, height of the undercut structure 181 is less than a sum of thicknesses of the patterned flat layer 17, the pixel definition layer 19, and the support layer 18.

In an embodiment, the array substrate 10 can further include a barrier layer 192 and a buffer layer 193, both of which are between the base substrate 11 and the active layer 12. In an embodiment, a packaging area 10D is defined between the display area 10A and the winding area 10B. The packaging area 10D is used for packaging purposes, so the first metal layer 14, the second metal layer 144, the third metal layer 16, the patterned flat layer 17, the pixel defining layer 19, and the support layer 18 and the like are not disposed within the packaging area 10D.

From above, the array substrate 10 of an embodiment of the present disclosure reduces width of the border formed by the winding area, by forming a first wiring pattern 141, a second wiring pattern 144A, a third wiring pattern 161, and an undercut structure 181 within the winding area, all of which are layer-stacked.

Figure 2:
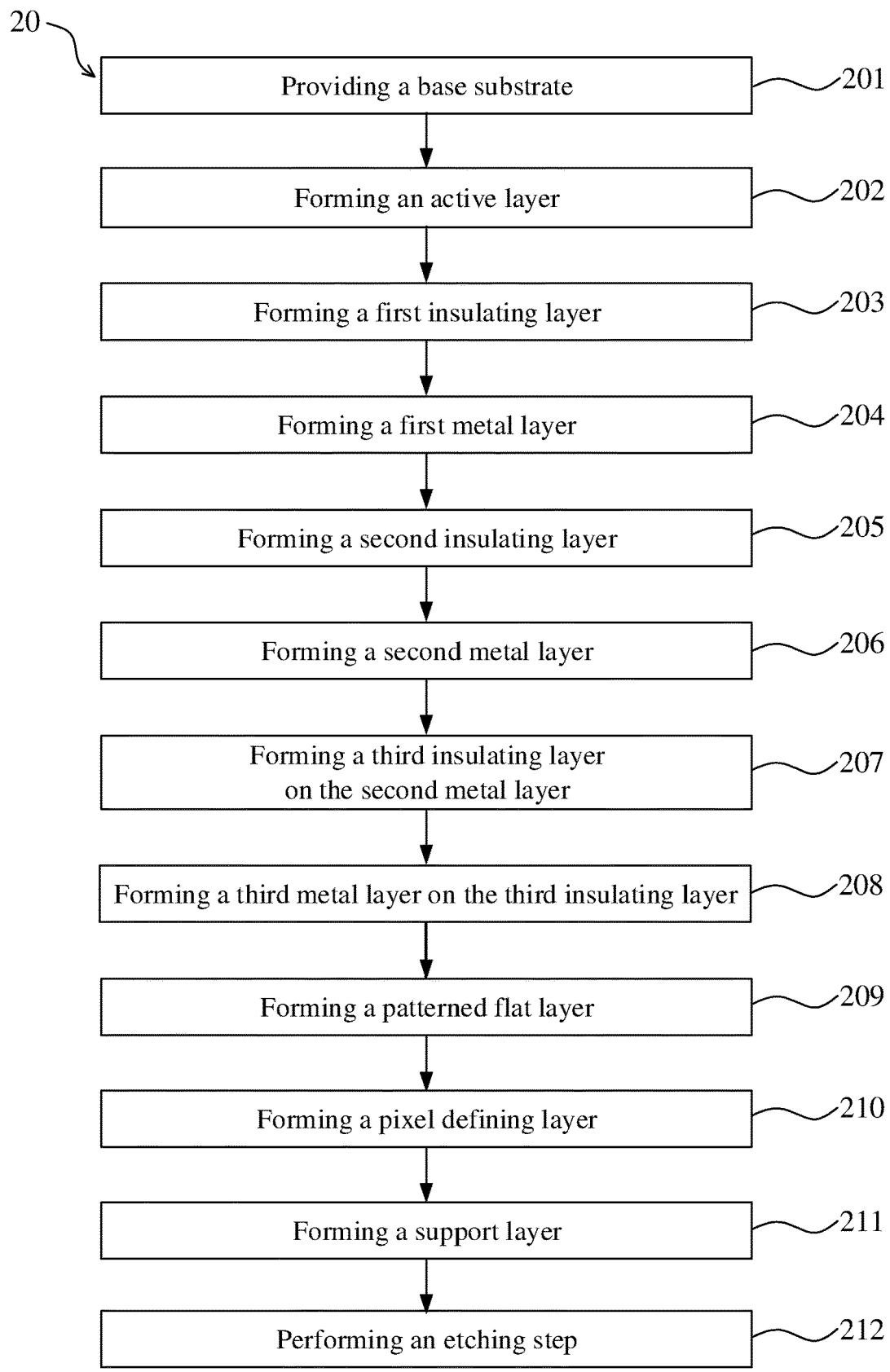
FIG. 2 is a flowchart showing a method of fabricating an array substrate in accordance with an embodiment of the present disclosure.
Figure 3A:
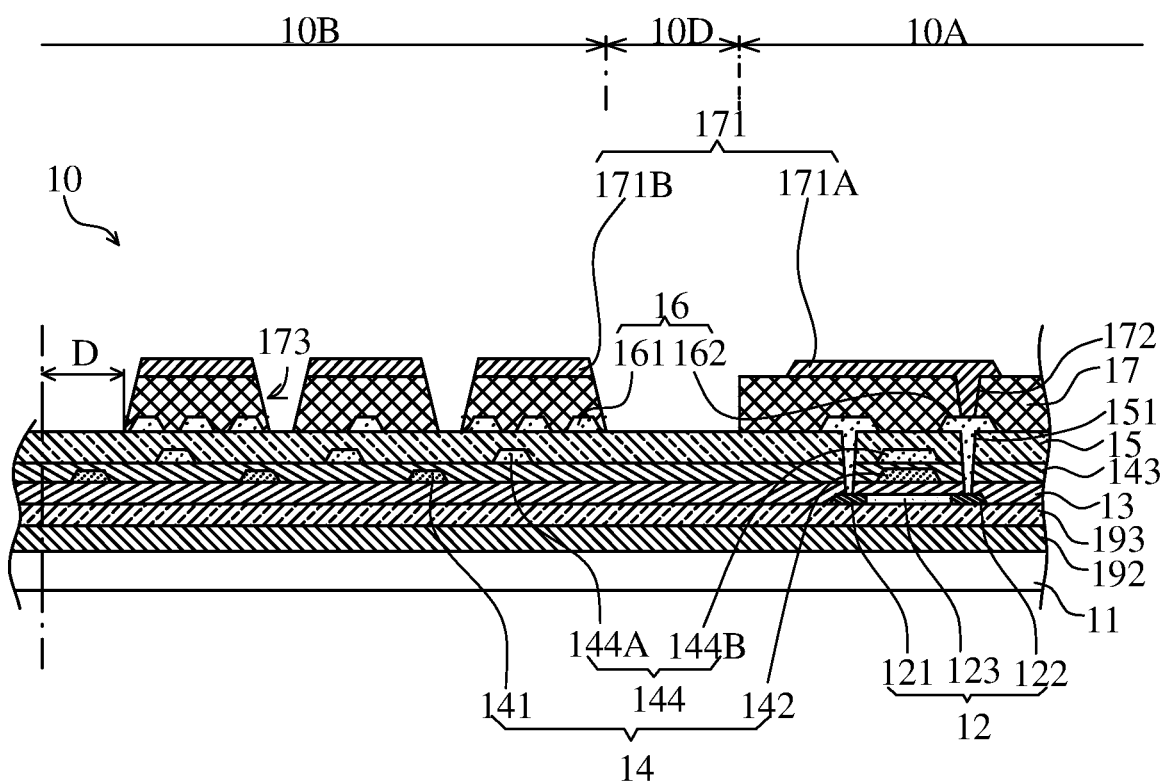
FIGS. 3A to 3B are schematic cross-sectional views showing respective steps of fabricating a method of fabricating an array substrate in accordance with an embodiment of the present disclosure.
Figure 3B:
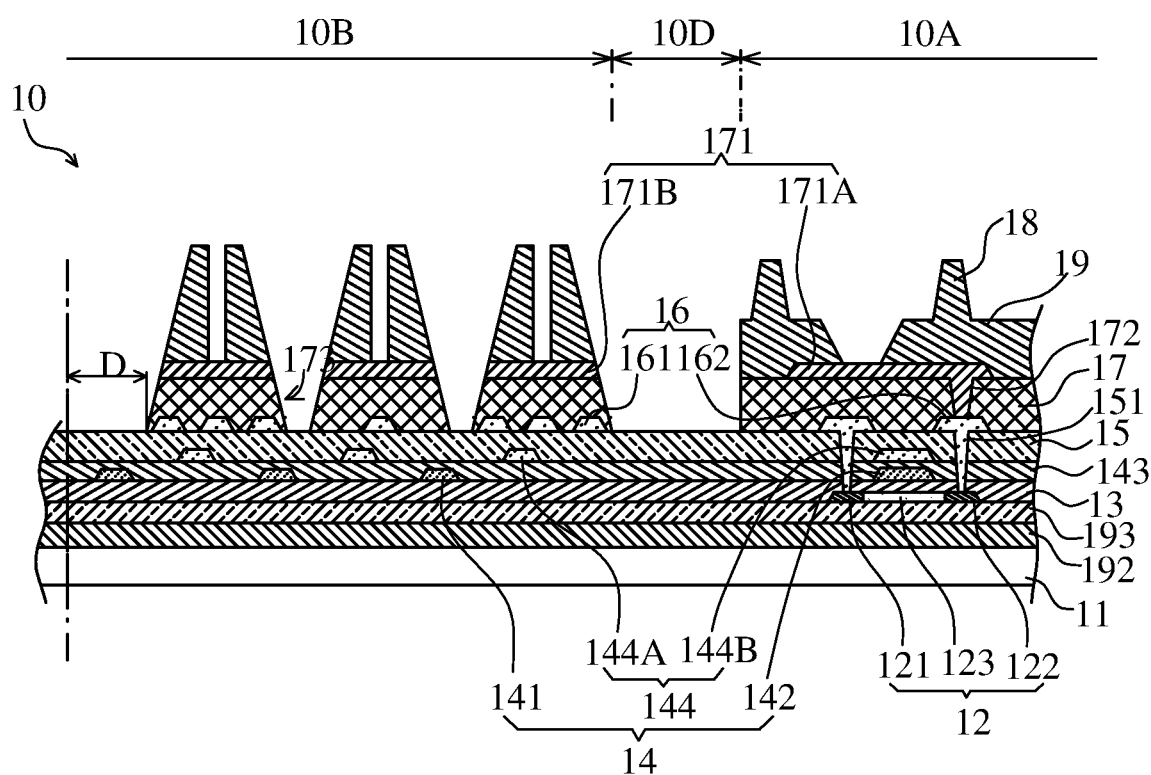

Refer to FIG. 2, FIG. 3A, and FIG. 3B. FIG. 2 is a flowchart showing a method 20 of fabricating an array substrate in accordance with an embodiment of the present disclosure. FIGS. 3A to 3B are schematic cross-sectional views showing respective steps of fabricating a method 20 of fabricating an array substrate in accordance with an embodiment of the present disclosure. In the method 20 of fabricating the array substrate in accordance with an embodiment of the present disclosure, the array substrate comprises an active area and a winding area. The method 20 of fabricating the array substrate comprises steps 201 to 212 of: providing a base substrate (step 201); forming an active layer on the base substrate within the active area (step 202); forming a first insulating layer on the active layer within the active area and on the base substrate within the winding area (step 203); forming a first metal layer on the first insulating layer, wherein the first metal layer comprises at least one first wiring pattern disposed on the first insulating layer within the winding area (step 204); forming a second insulating layer on the first metal layer (step 205); forming a second metal layer on the second insulating layer, wherein the second metal layer comprises at least one second wiring pattern disposed on the second insulating layer within the winding area (step 206); forming a third insulating layer on the second metal layer (step 207); forming a third metal layer on the third insulating layer, wherein the third metal layer comprises at least one third wiring pattern disposed on the third insulating layer within the winding area (step 208); forming a patterned flat layer on the second metal layer within the active area and on the second metal layer within the winding area (step 209); forming a pixel defining layer on the patterned flat layer (step 210); forming a support layer on the pixel defining layer (211); and performing an etching step on the pixel defining layer and the support layer, so that the pixel defining layer together with the support layer after performing the etching step have at least one undercut structure (step 212).

Referring to FIG. 2 together with FIG. 3A, the method 20 of fabricating the array substrate according to an embodiment of the present disclosure has a step 201 of providing a base substrate 11. In an embodiment, the base substrate 11 is, for example, a flexible substrate, a transparent substrate, or a flexible transparent substrate.

Referring to FIG. 2 together with FIG. 3A, the method 20 of fabricating the array substrate according to an embodiment of the present disclosure has a step 202 of forming an active layer 12 on the base substrate 11 within the active area 10A. The active layer 12 can include a source electrode doping area 121 and a drain electrode doping area 122, both of which are formed by doping. The source electrode doping area 121 and the drain electrode doping area 122 are located within the display area 10A. It is noted that materials and fabricating methods of the active layer 12 can be referred to common materials or fabricating methods in a general semiconductor process.

Referring to FIG. 2 together with FIG. 3A, the method 20 of fabricating the array substrate according to an embodiment of the present disclosure has a step 203 of forming a first insulating layer 13 on the active layer 12 within the active area 10A and on the base substrate 11 within the winding area 10B. It is noted that materials and fabricating methods of the first insulating layer 13 can be referred to common materials or fabricating methods in a general semiconductor process.

Referring to FIG. 2 together with FIG. 3A, the method 20 of fabricating the array substrate according to an embodiment of the present disclosure has a step 204 of forming a first metal layer 14 on the first insulating layer 13, wherein the first metal layer 14 comprises at least one first wiring pattern 141 disposed on the first insulating layer within the winding area. In an embodiment, the first metal layer 14 further comprises a first gate electrode structure pattern layer 142 disposed on the first insulating layer 13 within the active area 10A. In another embodiment, the first wiring pattern 141 and the first gate electrode structure pattern layer 142 are formed by a same photomask process, so that a number of photomasks used can be reduced.

Referring to FIG. 2 together with FIG. 3A, the method 20 of fabricating the array substrate according to an embodiment of the present disclosure has a step 205 of forming a second insulating layer 143 on the first metal layer 14. In an embodiment, the second insulating layer 143 is used as a gate electrode insulating layer.

Referring to FIG. 2 together with FIG. 3A, the method 20 of fabricating the array substrate according to an embodiment of the present disclosure has a step 206 of forming a second metal layer 144 on the second insulating layer 143, wherein the second metal layer 144 comprises at least one second wiring pattern 144A disposed on the second insulating layer 143 within the winding area 10B. In an embodiment, the second metal layer 144 further comprises a second gate electrode structure pattern layer 144B disposed on the second insulating layer 143 within the active area 10A. In another embodiment, the second wiring pattern 144A and the second gate electrode structure pattern layer 144B are formed by a same photomask process, so that a number of photomasks used can be reduced. In one aspect, the first gate electrode structure pattern layer 142 and the second gate electrode structure pattern layer 144B located within the active area are aligned with each other such that the first gate electrode structure pattern layer 142 and the second gate electrode structure pattern layer 144B form a storage capacitor. On the other hand, in an embodiment, the first wiring pattern 141 and the second wiring pattern 144A located within the winding area 10B do not need to form a storage capacitor, so the first wiring pattern 141 is no need to align with the second wiring pattern 144A.

Referring to FIG. 2 together with FIG. 3A, the method 20 of fabricating the array substrate according to an embodiment of the present disclosure has a step 207 of forming a third insulating layer 15 on the second metal layer 14. In an embodiment, the third insulating layer 15 can be used as an interlayer insulating layer (or interlayer dielectric (ILD)). It is noted that materials and fabricating methods of the third insulating layer 15 can be referred to common materials or fabricating methods in a general semiconductor process.

Referring to FIG. 2 together with FIG. 3A, the method 20 of fabricating the array substrate according to an embodiment of the present disclosure has a step 208 of forming a third metal layer 16 on the third insulating layer 15, wherein the third metal layer 16 comprises at least one third wiring pattern 161 disposed on the third insulating layer 15 within the winding area 10B. In an embodiment, the third metal layer 16 further comprises a source/drain electrode structure pattern 162 disposed on the third insulating layer 15 within the active area 10A, wherein the source/drain electrode structure pattern 162 is electrically connected to the active layer 12 through a first via hole 151 penetrating the third insulating layer 15, the second insulating layer 143, and the first insulating layer 13. In an example, the first via hole 151 can be formed by, for example, photolithography etching, and then the step of forming the third metal layer 16 is performed. In another embodiment, the third wiring pattern 161 and the source/drain electrode structure pattern 162 are formed by a same photomask process, so that a number of photomasks used can be reduced.

Referring to FIG. 2 together with FIG. 3A, the method 20 of fabricating the array substrate according to an embodiment of the present disclosure has a step 209 of forming a patterned flat layer 17 on the third metal layer 16 within the active area 10A and on the third metal layer 16 within the winding area 10B. The patterned flat layer 17 can be used to protect and partly planarize a transistor structure formed within the active area 10A and to protect and partly planarize the first wiring pattern 141, the second wiring pattern 144A, and the third wiring pattern 161 located in the winding area 10B. It is noted that materials and fabricating methods of the patterned flat layer 17 can be referred to common materials or fabricating methods in a general semiconductor process.

Referring to FIG. 2 together with FIG. 3B, the method 20 of fabricating the array substrate according to an embodiment of the present disclosure has a step 210 of forming a pixel defining layer 19 on the patterned flat layer 17. In an embodiment, materials of the pixel defining layer 19 can be referred to common materials in a general semiconductor process.

Refer to FIG. 2 together with FIG. 3A and FIG. 3B. In an embodiment, after the step 209 of forming the patterned flat layer and before the step 210 of forming the pixel defining layer, the method 20 of fabricating the array substrate further comprises steps of forming a fourth metal layer 171 disposed on the patterned flat layer 17, wherein the fourth metal layer 171 further comprises: an anode layer 171A and an etch stop layer 171B. The anode layer 171A is disposed on the patterned flat layer 17 within the display area 10A, wherein the anode layer 171A is electrically connected to the source/drain structure 162 through a second via hole 172 penetrating the patterned flat layer 17. In one example, the second via hole 172 may be formed by, for example, photolithography etching, followed by the step of forming the anode layer 171. The etch stop layer 171B is disposed on the patterned flat layer 17 within the winding area 10B, and can be used, for example, as a barrier layer when forming an undercut structure to be described later.

Referring to FIG. 2 together with FIG. 3B, the method 20 of fabricating the array substrate according to an embodiment of the present disclosure has a step 211 of forming a support layer 18 on the pixel defining layer 19. In an embodiment, the pixel defining layer 19 and the support layer 18 may be formed, for example, together (e.g., by a halftone photomask technique) or separately (e.g., using two photomasks). In another embodiment. Material of the pixel defining layer 19 and material of the supporting layer 18 may be the same (as shown in FIG. 3B) or different (as shown in FIG. 1A).

Referring to FIG. 1A together with FIG. 2, the method 20 of fabricating the array substrate according to an embodiment of the present disclosure has a step 212 of performing an etching step on the pixel defining layer 19 and the support layer 18, so that the pixel defining layer 19 together with the support layer 18 after performing the etching step have at least one undercut structure 181. In the step 212, the etch stop layer 171B can serve as a lower etch stop layer to cause the patterned inorganic layer 18 to be laterally etched by an etchant (i.e., wet etch), thereby having an undercut structure 181. In an embodiment, the etching step can be performed, for example, by covering another etch stop layer (not shown) on the support layer 18 by performing a dry etching. In one example, material of the another etch step layer may include at least one of indium gallium zinc oxide (IGZO), indium tin oxide (ITO), and indium zinc oxide IZO.

In an embodiment, the method 20 of fabricating the array substrate may further include steps of forming a barrier layer 192 and forming a buffer layer 193 between the base substrate 11 and the active layer 12. In an embodiment, a packaging area 10D is defined between the display area 10A and the winding area 10B. The packaging area 10D is used for packaging purposes, so the first metal layer 14, the second metal layer 144, the third metal layer 16, the patterned flat layer 17, the pixel defining layer 19, the supporting layer 18, and the like are not formed in the packaging area 10D.

From above, the method 20 of fabricating the array substrate in accordance with the present disclosure reduces width of the border formed by the winding area 10B, by forming the first wiring pattern 141, the second wiring pattern 144A, the third wiring pattern 161, and an undercut structure 181 within the winding area 10b, all of which are layer-stacked. Further, since the first wiring pattern 141, the second wiring pattern 144A, and the third wiring pattern 161 can be formed by incorporating into existing photomask processes (for example, photomask processes for forming the first gate electrode structure pattern layer 142, the second gate electrode structure pattern layer 144B, and the source/drain electrode structure pattern 162), a using number of photomasks can be reduced.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:

1. An array substrate, comprising an active area and a winding area, the array substrate comprising:
    a base substrate;
    an active layer disposed on the base substrate within the active area;
    a first insulating layer disposed on the active layer within the active area and on the base substrate within the winding area;
    a first metal layer disposed on the first insulating layer, wherein the first metal layer comprises at least one first wiring pattern disposed on the first insulating layer within the winding area, wherein the first metal layer further comprises a first gate electrode structure pattern layer disposed on the first insulating layer within the active area;
    a second insulating layer disposed on the first metal layer;
    a second metal layer disposed on the second insulating layer, wherein the second metal layer comprises at least one second wiring pattern disposed on the second insulating layer within the winding area;
    a third insulating layer disposed on the second metal layer;
    a third metal layer disposed on the third insulating layer, wherein the third metal layer comprises at least one third wiring pattern disposed on the third insulating layer within the winding area;
    a patterned flat layer disposed on the third metal layer within the active area and on the third metal layer within the winding area, wherein the patterned flat layer located within the winding area includes a plurality of protrusion patterns, and the at least one third wiring pattern includes a plurality of third wiring patterns, wherein one of the plurality of protrusion patterns covers the plurality of third wiring patterns;
    a pixel defining layer disposed on the patterned flat layer; and
    a support layer disposed on the pixel defining layer, wherein the pixel defining layer together with the support layer have at least one undercut structure.

2. The array substrate according to claim 1, wherein the second metal layer further comprises a second gate electrode structure pattern layer disposed on the second insulating layer within the active area.

3. The array substrate according to claim 2, wherein the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

4. The array substrate according to claim 3, further comprising a fourth metal layer disposed on the patterned flat layer, wherein the fourth metal layer further comprises:
    an anode layer disposed on the patterned flat layer within the display area, wherein the anode layer is electrically connected to the source/drain structure through a second via hole penetrating the patterned flat layer; and
    an etch stop layer disposed on the patterned flat layer within the winding area.

5. An array substrate, comprising an active area and a winding area, the array substrate comprising:
    a base substrate;
    an active layer disposed on the base substrate within the active area;
    a first insulating layer disposed on the active layer within the active area and on the base substrate within the winding area;
    a first metal layer disposed on the first insulating layer, wherein the first metal layer comprises at least one first wiring pattern disposed on the first insulating layer within the winding area;
    a second insulating layer disposed on the first metal layer;
    a second metal layer disposed on the second insulating layer, wherein the second metal layer comprises at least one second wiring pattern disposed on the second insulating layer within the winding area;
    a third insulating layer disposed on the second metal layer;
    a third metal layer disposed on the third insulating layer, wherein the third metal layer comprises at least one third wiring pattern disposed on the third insulating layer within the winding area;
    a patterned flat layer disposed on the third metal layer within the active area and on the third metal layer within the winding area;
    a pixel defining layer disposed on the patterned flat layer; and
    a support layer disposed on the pixel defining layer, wherein the pixel defining layer together with the support layer have at least one undercut structure.

6. The array substrate according to claim 5, wherein the first metal layer further comprises a first gate electrode structure pattern layer disposed on the first insulating layer within the active area.

7. The array substrate according to claim 6, wherein the second metal layer further comprises a second gate electrode structure pattern layer disposed on the second insulating layer within the active area.

8. The array substrate according to claim 7, wherein the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

9. The array substrate according to claim 8, further comprising a fourth metal layer disposed on the patterned flat layer, wherein the fourth metal layer further comprises:
    an anode layer disposed on the patterned flat layer within the display area, wherein the anode layer is electrically connected to the source/drain structure through a second via hole penetrating the patterned flat layer; and
    an etch stop layer disposed on the patterned flat layer within the winding area.

10. The array substrate according to claim 5, wherein the patterned flat layer located within the winding area includes a plurality of protrusion patterns, and the at least one third wiring pattern includes a plurality of third wiring patterns, wherein one of the plurality of protrusion patterns covers the plurality of third wiring patterns.

11. A method of fabricating an array substrate, the array substrate comprising an active area and a winding area, the method of fabricating the array substrate comprising steps of:
    providing a base substrate;
    forming an active layer on the base substrate within the active area;
    forming a first insulating layer on the active layer within the active area and on the base substrate within the winding area;
    forming a first metal layer on the first insulating layer, wherein the first metal layer comprises at least one first wiring pattern disposed on the first insulating layer within the winding area;
    forming a second insulating layer on the first metal layer;
    forming a second metal layer on the second insulating layer, wherein the second metal layer comprises at least one second wiring pattern disposed on the second insulating layer within the winding area;
    forming a third insulating layer on the second metal layer;
    forming a third metal layer on the third insulating layer, wherein the third metal layer comprises at least one third wiring pattern disposed on the third insulating layer within the winding area;
    forming a patterned flat layer on the third metal layer within the active area and on the third metal layer within the winding area;
    forming a pixel defining layer on the patterned flat layer;
    forming a support layer on the pixel defining layer; and
    performing an etching step on the pixel defining layer and the support layer, so that the pixel defining layer together with the support layer after performing the etching step have at least one undercut structure.

12. The method of fabricating the array substrate according to claim 11, wherein the first metal layer further comprises a first gate electrode structure pattern layer disposed on the first insulating layer within the active area, and the second metal layer further comprises a second gate electrode structure pattern layer disposed on the second insulating layer within the active area.

13. The method of fabricating the array substrate according to claim 12, wherein the third metal layer further comprises a source/drain electrode structure pattern disposed on the third insulating layer within the active area, wherein the source/drain electrode structure pattern is electrically connected to the active layer through a first via hole penetrating the third insulating layer, the second insulating layer, and the first insulating layer.

14. The method of fabricating the array substrate according to claim 13, wherein after the step of forming the patterned flat layer and before the step of forming the pixel defining layer, the method of fabricating the array substrate further comprises steps of: forming a fourth metal layer disposed on the patterned flat layer, wherein the fourth metal layer further comprises:
    an anode layer disposed on the patterned flat layer within the display area, wherein the anode layer is electrically connected to the source/drain structure through a second via hole penetrating the patterned flat layer; and
    an etch stop layer disposed on the patterned flat layer within the winding area.

15. The method of fabricating the array substrate according to claim 11, wherein the patterned flat layer located within the winding area includes a plurality of protrusion patterns, and the at least one third wiring pattern includes a plurality of third wiring patterns, wherein one of the plurality of protrusion patterns covers the plurality of third wiring patterns.

\* \* \* \* \*